(12) United States Patent
Kondo

(10) Patent No.: US 11,799,059 B2
(45) Date of Patent: Oct. 24, 2023

(54) LIGHT-EMITTING ELEMENT

(71) Applicant: NICHIA CORPORATION, Anan (JP)

(72) Inventor: Shinya Kondo, Tokushima (JP)

(73) Assignee: NICHIA CORPORATION, Anan (JP)

(*) Notice: Subject to any disclaimer, the term of this patent is extended or adjusted under 35 U.S.C. 154(b) by 235 days.

(21) Appl. No.: 17/353,265

(22) Filed: Jun. 21, 2021

(65) Prior Publication Data

US 2021/0408335 A1 Dec. 30, 2021

Related U.S. Application Data

(60) Provisional application No. 63/044,058, filed on Jun. 25, 2020.

(51) Int. Cl.
*H01L 33/38* (2010.01)
*H01L 33/40* (2010.01)
*H01L 33/24* (2010.01)

(52) U.S. Cl.
CPC ............ *H01L 33/382* (2013.01); *H01L 33/24* (2013.01); *H01L 33/405* (2013.01)

(58) Field of Classification Search
CPC ...... H01L 33/24; H01L 33/382; H01L 33/405
See application file for complete search history.

(56) References Cited

U.S. PATENT DOCUMENTS

| 2010/0117111 A1 | 5/2010 | Illek et al. |
| 2013/0207153 A1 | 8/2013 | Kamiya et al. |
| 2016/0315225 A1* | 10/2016 | Kageyama ............... H01L 33/38 |
| 2016/0343926 A1 | 11/2016 | Kageyama |
| 2016/0351756 A1 | 12/2016 | Noichi et al. |
| 2017/0018694 A1* | 1/2017 | Emura .................. H01L 33/382 |

FOREIGN PATENT DOCUMENTS

| JP | 2010-525586 A | 7/2010 |
| JP | 2013-168444 A | 8/2013 |
| JP | 2014-022608 A | 2/2014 |
| JP | 2016-208012 A | 12/2016 |
| JP | 2016-219787 A | 12/2016 |

* cited by examiner

*Primary Examiner* — Matthew C Landau
*Assistant Examiner* — Dmitriy Yemelyanov
(74) *Attorney, Agent, or Firm* — Foley & Lardner LLP

(57) ABSTRACT

A light-emitting element includes a semiconductor layered body including an n-side semiconductor layer having a first region and second regions, a p-side semiconductor layer on the first region, and a light-emitting layer between the first region and the p-side semiconductor layer; an insulating film defining at least one p-side opening above the p-side semiconductor layer and n-side openings each defined above a corresponding second region; an n-side electrode connected to each second region at each corresponding n-side opening; and a p-side electrode electrically connected to the p-side semiconductor layer through the p-side opening. In a top view, the n-side electrode includes at least one base portion on the first region, at least one first extending portion extending in a first direction from the base portion, and at least one second extending portion extending in the first direction from the base portion.

20 Claims, 6 Drawing Sheets

LIGHT-EMITTING ELEMENT

CROSS-REFERENCE TO RELATED APPLICATION

This application claims the benefit of U.S. Provisional Application No. 63/044,058, filed on Jun. 25, 2020, which is hereby incorporated by reference in its entirety.

BACKGROUND

The present disclosure relates to a light-emitting element.

Japanese Patent Application Publication No. 2014-22608 describes a light-emitting element in which an insulating film covering a p-side semiconductor layer and defining openings is disposed on the p-side semiconductor layer disposed on an n-side semiconductor layer, and an n-side electrode is disposed in the openings of the insulating film to be electrically connected with the n-side semiconductor layer.

SUMMARY

Such a light-emitting element is required to have high reliability.

A light-emitting element according to one embodiment of the present invention includes: a semiconductor layered body including: an n-side semiconductor layer having a first region and a plurality of second regions, a p-side semiconductor layer disposed on the first region, and a light-emitting layer disposed between the first region and the p-side semiconductor layer; an insulating film defining at least one p-side opening above the p-side semiconductor layer and a plurality of n-side openings each defined above a corresponding one of the plurality of second regions; an n-side electrode connected to each of the second regions at each corresponding one of the n-side openings; and a p-side electrode electrically connected to the p-side semiconductor layer through the p-side opening. In a top view, the n-side electrode includes: at least one base portion located on the first region, at least one first extending portion having a first length, the at least one first extending portion extending in a first direction from the base portion and being connected to at least one of the second regions, and at least one second extending portion having a second length longer than the first length, the at least one second extending portion extending in the first direction from the base portion and being connected to multiple ones of the second regions. The second regions are not located between an end portion of the first extending portion and an end portion of the n-side semiconductor layer in the first direction.

According to a light-emitting element of one embodiment of the present invention, it is possible to provide a light-emitting element having higher reliability.

DETAILED DESCRIPTION

Figure 1:
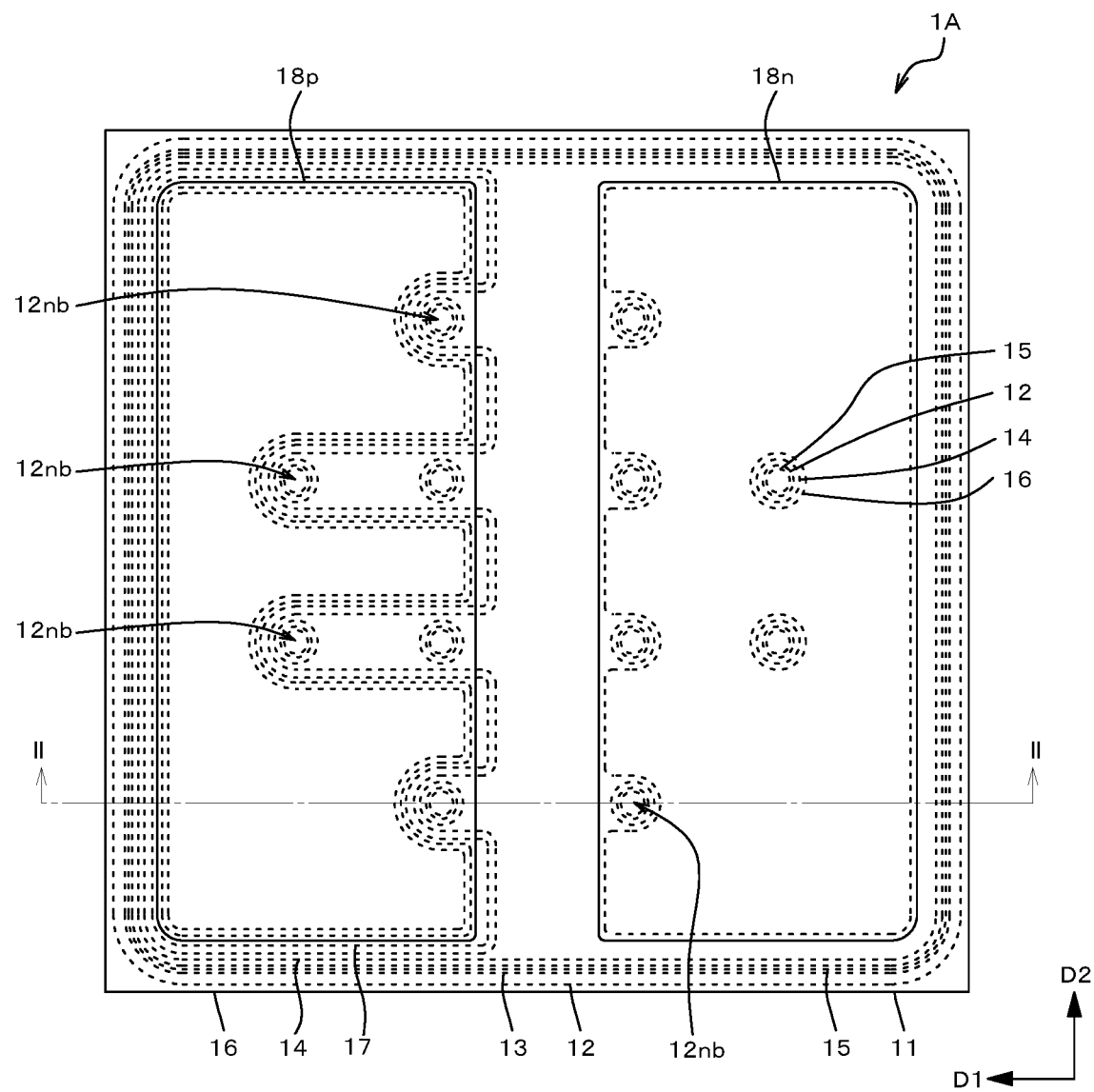
FIG. 1 is a schematic plan view illustrating a configuration of a light-emitting element according to a first embodiment.

Embodiments of a light-emitting element according to the present invention will be described below.

The drawings referred to in the description below are diagrams that schematically illustrate the present invention. Accordingly, scales and intervals of elements, positional relationships, and the like may be exaggerated, and illustration of some of the elements may be omitted in the drawings. In addition, scales of elements and intervals between elements may not be the same between a plan view and a cross-sectional view. Further, in the description below, elements having the same terms and reference numerals generally represent the same elements or equivalent elements, and a detailed description of such elements will be omitted as appropriate.

In the present specification, "upper," "lower," and the like indicate relative positions between components in the drawings referenced for description and are not intended to indicate absolute positions unless otherwise stated.

First Embodiment

A configuration of a light-emitting element 1A according to a first embodiment of the present invention will be described with reference to FIGS. 1 to 4. The cross-sectional view illustrated in FIG. 2 schematically illustrates a cross-section taken along line II-II in the plan view illustrated in FIG. 1. A distance interval in the cross-sectional view of FIG. 2 is indicated with appropriate enlargement or reduction of a distance interval (length of an element) in the plan view of FIG. 1 for ease of understanding a cross-sectional structure, and the distance intervals in the drawings may not correspond to each other. In addition, in FIGS. 3 and 4, a region where elements are to be disposed in a top view is indicated by hatching in order to describe the structure of the light-emitting element 1A according to the first embodiment.

Configurations of respective portions of the light-emitting element 1A will be described sequentially with reference to FIGS. 1 to 4.

The light-emitting element 1A includes a semiconductor layered body 12, an insulating film 15, an n-side electrode 13, and a p-side electrode 17. The semiconductor layered body 12 is disposed on a substrate 11. A reflective electrode 14 is disposed on a portion of the semiconductor layered body 12. A protection film 16 is disposed on a portion of a surface of the n-side electrode 13 and a portion of a surface of the p-side electrode 17. An n-side external electrode 18n is disposed on the n-side electrode 13. A p-side external electrode 18p is disposed on the p-side electrode 17. A current is supplied between the n-side electrode 13 and the p-side electrode 17 of the light-emitting element 1A through the n-side external electrode 18n and the p-side external electrode 18p. In addition, when a current is supplied between the n-side electrode 13 and the p-side electrode 17, a light-emitting layer 12a of the light-emitting element 1A emits light. Light emitted by the light-emitting layer 12a of the light-emitting element 1A propagates through the semiconductor layered body 12 and is mainly extracted to the outside from the lower surface or the lateral surfaces of the substrate 11.

Substrate 11

For the substrate 11, a substrate material on which a semiconductor can be epitaxially grown can be used. A substrate made of a material such as sapphire or gallium nitride is used as the substrate 11. In the present embodiment, it is preferable to use a sapphire substrate, which is light-transmissive, in view of improving the light extraction efficiency of the light-emitting element 1A.

Semiconductor Layered Body 12

The semiconductor layered body 12 is a layered body layered on the substrate 11, and includes an n-side semiconductor layer 12n, the light-emitting layer 12a, and a p-side semiconductor layer 12p from the side of the substrate 11 in this order. A semiconductor such as $In_xAl_yGa_{1-X-Y}N$ ($0 \leq X$, $0 \leq Y$, $X+Y<1$) is preferably used for the n-side semiconductor layer 12n, the light-emitting layer 12a, and the p-side semiconductor layer 12p. In addition, each of these semiconductor layers may have a single-layered structure, or may have a layered structure or a superlattice structure of a plurality of layers having different compositions, film thicknesses, and the like. In particular, the light-emitting layer 12a is preferably a single quantum well structure or a multiple quantum well structure in which thin films exhibiting a quantum effect are layered.

The n-side semiconductor layer 12n includes a first region 12na and a plurality of second regions 12nb. The p-side semiconductor layer 12p is disposed in the first region 12na. The light-emitting layer 12a is disposed between the first region 12na and the p-side semiconductor layer 12p. The light-emitting layer 12a is disposed on the first region 12na, and the p-side semiconductor layer 12p is disposed on the light-emitting layer 12a. In a top view, each of the plurality of second regions 12nb is surrounded by the first region 12na. The light-emitting layer 12a and the p-side semiconductor layer 12p are not disposed on the second regions 12nb, and the n-side semiconductor layer 12n is exposed from the light-emitting layer 12a and the p-side semiconductor layer 12p on the second regions 12nb. The n-side electrode 13 and the second regions 12nb of the n-side semiconductor layer 12n are in contact with each other through respective n-side openings 15n to be electrically connected to each other. In a top view, each second region 12nb has, for example, a circular shape or an elliptical shape.

In a case in which the second regions 12nb in a top view has, for example, a circular shape, the diameter of the second regions 12nb can be set appropriately in accordance with the size of the semiconductor layered body 12. The diameter of the second regions 12nb can be in a range of, for example, 5 µm to 150 µm, and preferably from 20 µm to 100 µm. Reduction in the diameter of the second regions 12nb allows for reducing a region where the light-emitting layer 12a and the like are partially removed, and thus the light-emitting region can be increased. Increase in the diameter of the second regions 12nb allows for increasing the contact area between the n-side electrode 13 and the n-side semiconductor layer 12n, and thus an increase in a forward voltage Vf can be reduced.

Figure 2:
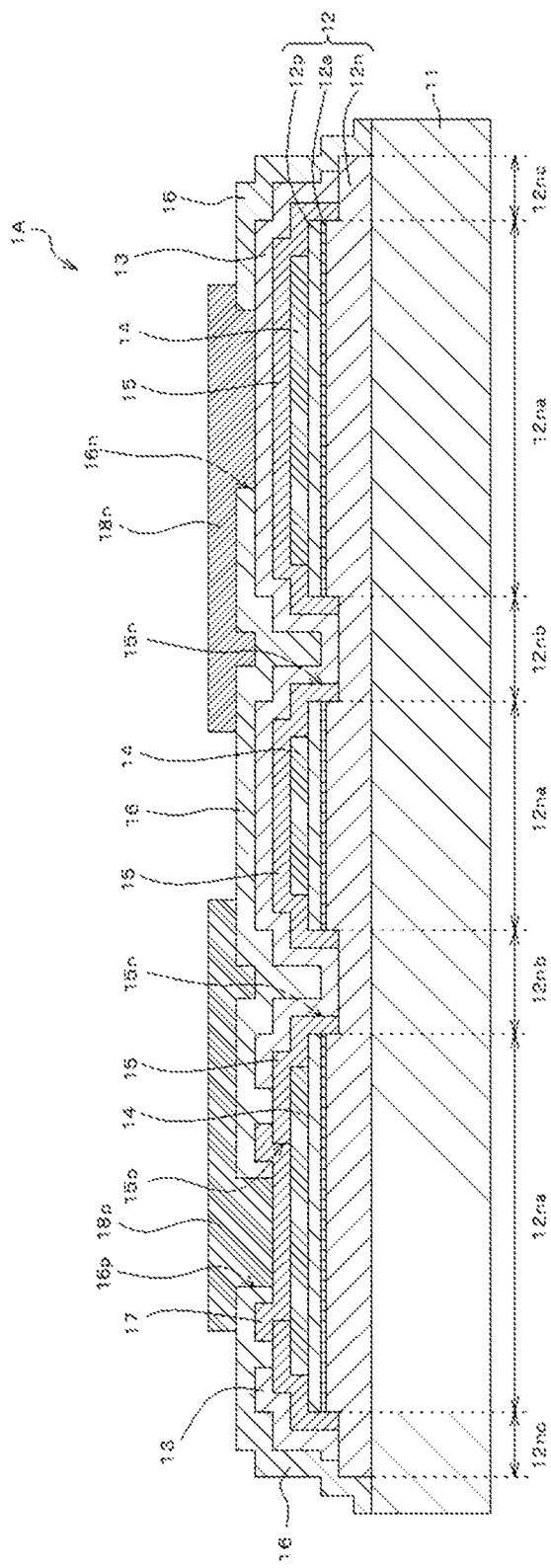
FIG. 2 is a schematic cross-sectional view taken along line II-II in FIG. 1.

As illustrated in FIG. 1, in the present embodiment, the n-side semiconductor layer 12n includes twelve second regions 12nb. The plurality of second regions 12nb are preferably located across a wide area of the n-side semiconductor layer 12n in a top view. For example, it is preferable that the plurality of second regions 12nb be arranged at equal intervals and disposed line-symmetrically with respect to a bisector that bisects one side of the n-side semiconductor layer 12n. With this arrangement of the second regions 12nb, a current supplied through the n-side electrode 13 can be more uniformly diffused to the n-side semiconductor layer 12n. In the present embodiment, the second regions 12nb are not located in the vicinity of four corners of the n-side semiconductor layer 12n, but the first region 12na is provided in the vicinity of four corners of the n-side semiconductor layer 12n instead.

The n-side semiconductor layer 12n further includes a third region 12nc located outward of the first region 12na. The third region 12nc extends along an outer edge of the first region 12na and surrounds the first region 12na. Similarly to the second regions 12nb, the light-emitting layer 12a and the p-side semiconductor layer 12p are not provided in the third region 12nc, and the n-side semiconductor layer 12n in the third region 12nc is exposed from the light-emitting layer 12a and the p-side semiconductor layer 12p. The n-side electrode 13 and the third region 12nc of the n-side semiconductor layer 12n are electrically connected to each other. The width of the third region 12nc of the n-side semiconductor layer 12n can be in a range of, for example, 5 µm to 100 m, and preferably from 10 µm to 50 µm. In a top view, the n-side semiconductor layer 12n is not disposed on the upper surface of the substrate 11 located outside the third region 12nc, and the upper surface is exposed from the n-side semiconductor layer 12n.

In a top view, the semiconductor layered body 12 has a rectangular shape. In a case in which the semiconductor layered body 12 has, for example, a square shape in a top view, the semiconductor layered body 12 can have a size in which the length of one side is in a range of, for example, 300 µm to 3000 µm, and preferably from 500 µm to 1500 µm.

Reflective Electrode 14

As illustrated in FIG. 2, the reflective electrode 14 is disposed on the p-side semiconductor layer 12p. In the present embodiment, the reflective electrode 14 defines 12 openings at positions corresponding to the second regions 12nb of the n-side semiconductor layer 12n.

The reflective electrode 14 is adapted to diffuse a current supplied through the p-side electrode 17 to the p-side semiconductor layer 12p. It is preferable that the reflective electrode 14 have high light reflectivity with respect to light emitted from the light-emitting layer 12a. It is preferable that the reflective electrode 14 have a reflectance of, for example, 80% or greater, and preferably 90% or greater with respect to light emitted from the light-emitting layer 12a. For the reflective electrode 14, a metal material having good conductivity and light reflectivity can be used. For the reflective electrode 14, for example, Ag, Al, Ni, Ti, Pt, or alloys containing these metals as main components can be preferably used as a metal material. In addition, a single layer or a layered structure formed of these metal materials can be used for the reflective electrode 14.

Insulating Film 15

As illustrated in FIG. 2, the insulating film 15 is disposed on the semiconductor layered body 12 and covers a surface of the semiconductor layered body 12 and a surface of the reflective electrode 14. The insulating film 15 defines at least one p-side opening 15p on or above the p-side semiconductor layer 12p, and n-side openings 15n, each located on a respective one of the second regions 12nb of the n-side semiconductor layer 12n. The n-side electrode 13 is connected to the second regions 12nb of the n-side semiconductor layer 12n in respective n-side openings 15n. The p-side electrode 17 is connected to the p-side semiconductor layer 12p through the p-side opening 15p. The insulating film 15 is located on portions of the second regions 12nb and a portion of the third region 12nc of the n-side semiconductor layer 12n. The n-side electrode 13 is connected to a portion of each of the second regions 12nb where the insulating film 15 is not located.

A metal oxide or a metal nitride can be used for the insulating film 15. An oxide or a nitride containing at least one material selected from the group consisting of, for example, Si, Ti, Zr, Nb, Ta, and Al can be preferably used for the insulating film 15. For example, $SiO_2$, SiN, or the like is used for the insulating film 15. Also, a single layer or a layered structure formed of these metal oxides or metal nitrides can be used for the insulating film 15. For the insulating film 15, two or more types of dielectric layers having different refractive indices may be layered to form a distributed Bragg reflector (DBR) film.

n-Side Electrode 13, p-Side Electrode 17

Figure 3:
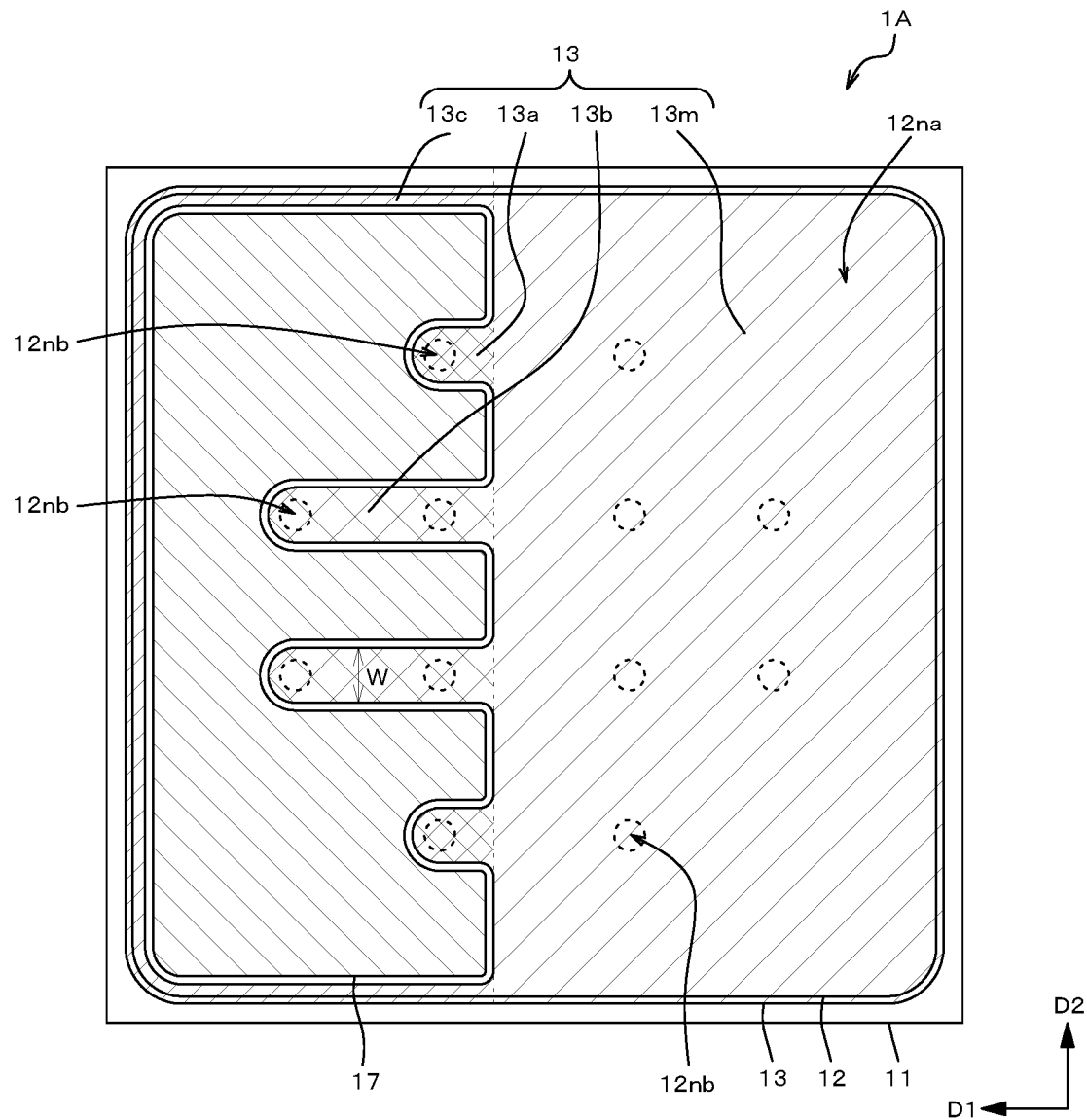
FIG. 3 is a diagram schematically illustrating a region where an n-side electrode and a p-side electrode are disposed in the light-emitting element according to the first embodiment.

FIG. 3 is a diagram illustrating a region where the n-side electrode 13 is disposed and a region where the p-side electrode 17 is disposed in a top view, the regions being indicated by hatchings. As illustrated in FIG. 3, the n-side electrode 13 includes at least one base portion 13m located on the first region 12na, at least one first extending portion 13a extending from the base portion 13m in a first direction D1, and at least one second extending portion 13b extending from the base portion 13m in the first direction D1. The first extending portion 13a and the second extending portion 13b are connected to second regions 12nb of the n-side semiconductor layer 12n. The first extending portion 13a has a first length, and the second extending portion 13b has a second length that is longer than the first length. The second length is, for example, between two times and five times the length of the first length. A direction orthogonal to the first direction D1 is defined as a second direction D2. In the first direction D1, the second regions 12nb of the n-side semiconductor layer 12n are not located between an end portion of the first extending portion 13a and an end portion of the n-side semiconductor layer 12n. In the first direction D1, the second regions 12nb of the n-side semiconductor layer 12n are not located between an end portion of the second extending portion 13b and an end portion of the n-side semiconductor layer 12n. The expressions "end of the first extending portion 13a" and the "end of the second extending portion 13b" refers to a portion of the first extending portion 13a and a portion of the second extending portion 13b, respectively, that are farthest away from the base portion 13m in the first direction D1.

The base portion 13m is located on the first region 12na and is connected to the plurality of second regions 12nb. In addition, the base portion 13m is connected to the third region 12nc. The base portion 13m is continuously located in the first region 12na, the second regions 12nb, and the third region 12nc of the n-side semiconductor layer 12n. In the present embodiment, the base portion 13m is connected to six second regions 12nb of the second regions 12nb. The base portion 13m is located in a region where the p-side external electrode 18p is not disposed. In the present embodiment, the base portion 13m has a substantially rectangular shape that is vertically elongated in a top view, as illustrated in FIG. 3.

In the present embodiment, as illustrated in FIGS. 1 to 3, a single first extending portion 13a is connected to a single second region 12nb. Further, a single second extending portion 13b is connected to two second regions 12nb. A single second extending portion 13b is connected to a single second region 12nb located close to the base portion 13m and a single second region 12nb located close to the end of the second extending portion 13b. A quantity of the second regions 12nb connected to one of the at least one second extending portion 13b is greater than a quantity of the second regions 12nb connected to one of the at least one first extending portion 13a. Furthermore, a quantity of the second regions 12nb connected to the base portion 13m is greater than a quantity of the second regions 12nb connected to one second extending portion 13b.

The n-side electrode 13 includes a third extending portion 13c extending from the base portion 13m and connected to the third region 12nc of the n-side semiconductor layer 12n. The third extending portion 13c is located between the p-side electrode 17 and an outer periphery of the semiconductor layered body 12 in a top view. The third extending portion 13c extends along an outer edge of the p-side electrode 17. The third extending portion 13c includes a portion extending in the first direction D1 and a portion extending in the second direction D2. With the third extending portion 13c, it is possible to increase a contact area between the n-side electrode 13 and the n-side semiconductor layer 12n, so that an increase in the forward voltage Vf of the light-emitting element 1A can be reduced.

In FIGS. 1 and 3, the n-side electrode 13 includes a plurality of the first extending portions 13a and a plurality of the second extending portions 13b. In the present embodiment, the plurality of second extending portions 13b are located between the plurality of first extending portions 13a in the second direction D2. The plurality of second extending portions 13b are located between one first extending portion 13a and another first extending portion 13a. With this arrangement, a region where the second regions 12nb is not formed is easily secured between the end portion of the first extending portion 13a and the end of the n-side semiconductor layer 12n.

It is preferable that the width of the first extending portion 13a be set to be the same as the width of the second extending portion 13b. The terms "width of the first extending portion 13a" and "width of the second extending portion 13b" refer to a length of the first extending portion 13a and a length of the second extending portion 13b, respectively, in the second direction D2. A width of the second extending portion 13b in the second direction D2 is, for example, a width W illustrated in FIG. 3. In the present embodiment, each of the first extending portion 13a and the second extending portion 13b has a width that is uniform between the base portion 13m side and the vicinity of the tip end thereof in the first direction D1. With this structure, it is possible to reduce variations in a current supplied to the n-side semiconductor layer 12n and improve an in-plane light emission intensity distribution of the light-emitting element 1A. Each of the first extending portion 13a and the second extending portion 13b preferably has a width in a range of 1% to 30%, and more preferably in a range of 2% to 25% of a corresponding one side of the semiconductor layered body 12. This allows for securing a region where the p-side electrode 17 is disposed and improving in-plane light emission intensity distribution of the light-emitting element 1A.

It is preferable that the plurality of first extending portions 13a and the plurality of second extending portions 13b be arranged at equal intervals in the second direction D2 in a top view. In other words, it is preferable that a distance between adjacent second extending portions 13b be equal to a distance between a first extending portion 13a and a second extending portion 13b that are adjacent to each other. Further, in a case in which the first extending portions 13a are adjacent to each other, it is preferable that distance between the first extending portions 13a is uniform. With such an arrangement, a current supplied through the n-side electrode 13 can be diffused more uniformly with respect to the n-side semiconductor layer 12n, and thus it is possible to improve in-plane light emission intensity distribution of the light-emitting element 1A.

As illustrated in FIGS. 1 and 2, a portion of the p-side electrode 17 is disposed in the p-side opening 15p and is electrically connected to the reflective electrode 14. The p-side electrode 17 is electrically connected with the p-side semiconductor layer 12p through the reflective electrode 14. The p-side electrode 17 is surrounded by the n-side electrode 13 in a top plan view. The p-side electrode 17 is disposed without overlapping the n-side electrode 13 in a top plan view.

A metal material can be used for the n-side electrode 13 and the p-side electrode 17, for example, a single metal such as Ag, Al, Ni, Rh, Au, Cu, Ti, Pt, Pd, Mo, Cr, or W, or alloys containing these metals as main components can be preferably used. In a case in which an alloy is used, the alloy may contain a non-metal element such as Si as a composition element, for example, such as an AlSiCu alloy. In addition, a single layer or a layered structure formed of these metal materials can be used as the n-side electrode 13 and the p-side electrode 17.

Protection Film 16

Figure 4:
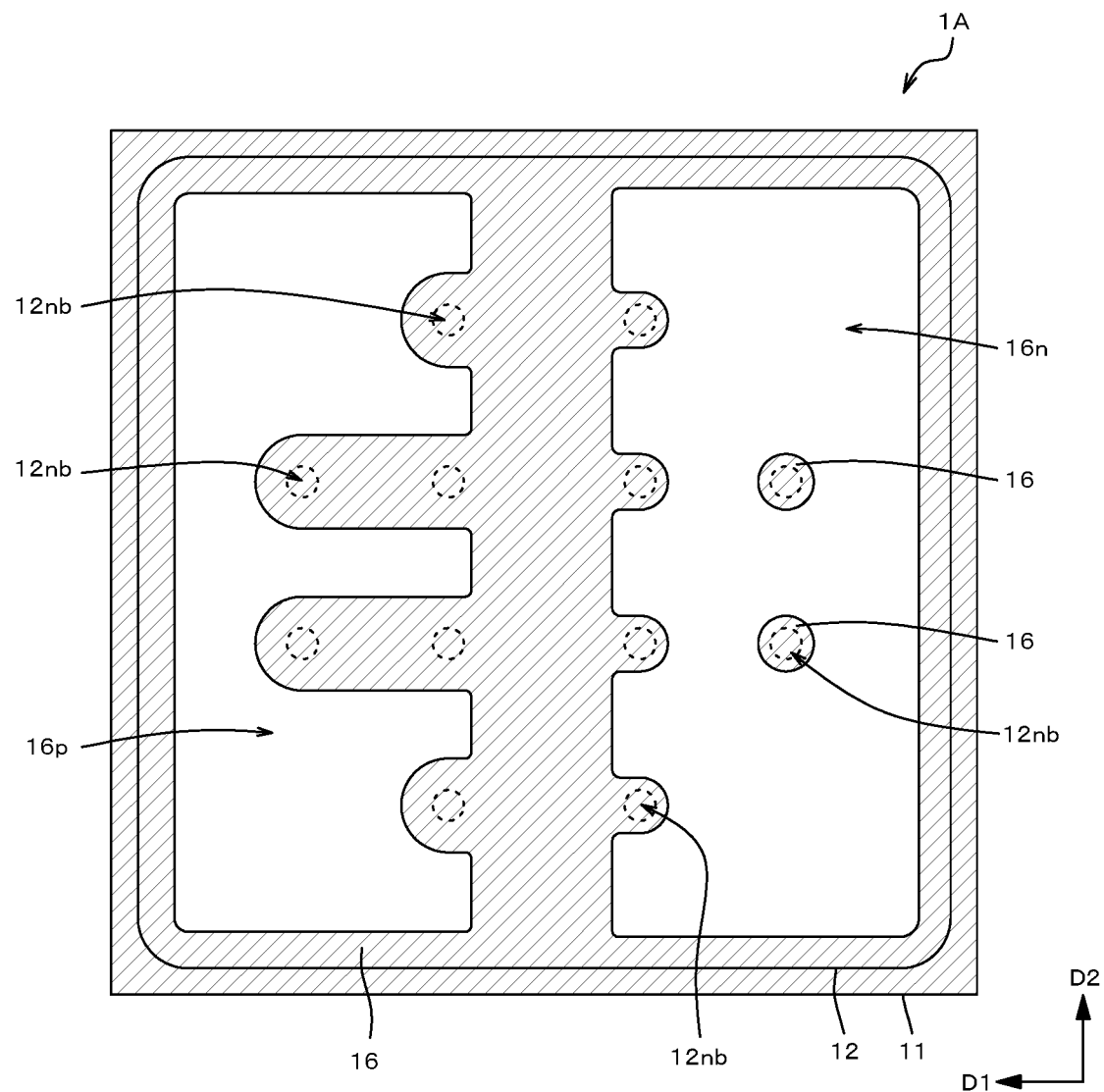
FIG. 4 is a diagram schematically illustrating a region where a protection film is disposed in the light-emitting element according to the first embodiment.

As illustrated in FIGS. 1 and 2, the protection film 16 is disposed to cover the n-side electrode 13 and the p-side electrode 17. In FIG. 4, the protection film 16 is disposed in the region indicated by the hatching. The protection film 16 defines an n-side hole 16n on a portion of the n-side electrode 13. In addition, the protection film 16 defines a p-side hole 16p on a portion of the p-side electrode 17. The protection film 16 can cover an upper surface and lateral surfaces of the n-side semiconductor layer 12n and a portion of an upper surface of the substrate 11 that is exposed from the n-side semiconductor layer 12n. As illustrated in FIG. 4, the protection film 16 is disposed to cover all of the second regions 12nb in a top view. In the present embodiment, the protection film 16 includes a portion that integrally covers 10 second regions 12nb among the 12 second regions 12nb and portions that covers the other two second regions 12nb each having an island shape. Each of the portions of the protection film 16 having an island shape is surrounded by a corresponding one of the n-side holes 16n in a top view.

A metal oxide or a metal nitride can be used for the protection film 16 similarly to the insulating film 15 described above. For example, an oxide or a nitride containing at least one type of material selected from the group consisting of Si, Ti, Zr, Nb, Ta, and Al can be preferably used. For example, $SiO_2$, SiN, or the like is used for protection film 16.

n-Side External Electrode 18n, p-Side External Electrode 18p

As illustrated in FIGS. 1 and 2, the n-side external electrode 18n is electrically connected with the n-side electrode 13 in the n-side hole 16n of the protection film 16. In addition, as illustrated in FIGS. 1 and 2, the p-side external electrode 18p is electrically connected with the p-side electrode 17 in the p-side hole 16p of the protection film 16. The p-side external electrode 18p is disposed to cover the first region 12na of the n-side semiconductor layer 12n located between the end portion of the first extending portion 13a and the end portion of the n-side semiconductor layer 12n in the first direction D1, and the plurality of second regions 12nb of the n-side semiconductor layer 12n. The n-side external electrode 18n is disposed to cover the first region 12na of the n-side semiconductor layer 12n and the plurality of second regions 12nb of the n-side semiconductor layer 12n. The p-side external electrode 18p, the protection film 16, and the n-side electrode 13 are disposed to overlap each other on corresponding ones of the second regions 12nb of the n-side semiconductor layer 12n.

Electrical characteristics of the light-emitting element 1A can be measured by bringing a member for inspection into contact with each of the n-side external electrode 18n and the p-side external electrode 18p. For example, an electrically conductive member having thin and pointed tip end portions is used as the member for inspection, and each of the tip end portions is brought into contact with a corresponding one of the n-side external electrode 18n and the p-side external electrode 18p at the time of measurement. When the member for inspection is brought into contact, it is preferable that the member for inspection be brought into contact with the n-side external electrode 18n and the p-side external electrode 18p that cover the first region 12na of the n-side semiconductor layer 12n. This is because the p-side external electrode 18p and the n-side electrode 13 are disposed to overlap each other in the second regions 12nb. For example, in a case in which the member for inspection is brought into contact with the p-side external electrode 18p disposed on the second regions 12nb of the n-side semiconductor layer 12n, the protection film 16 disposed on the second regions 12nb and positioned between the p-side external electrode 18p and the n-side electrode 13 may be damaged. Such a damage may cause electrical conduction between the p-side external electrode 18p and the n-side electrode 13, which results in deterioration in the reliability of the light-emitting element 1A. In the present embodiment, a portion of the n-side external electrode 18n and a portion of the p-side external electrode 18p that cover the first region 12na have relatively large area dimensions at regions near four corner portions of the semiconductor layered body 12. With this structure, the member for inspection is easily brought into contact with the p-side external electrode 18p covering the first region 12na of the n-side semiconductor layer 12n, and thus the reliability of the light-emitting element 1A can be improved.

The n-side external electrode 18n and the p-side external electrode 18p have a substantially rectangular shape in a top view. In view of improving mounting properties of the light-emitting element 1A, it is preferable that the n-side external electrode 18n and the p-side external electrode 18p have substantially the same size. It is preferable that one side of each of the n-side external electrode 18n and the p-side external electrode 18p have a length in a range of, for example, 25% to 90% of a corresponding side of the semiconductor layered body 12. Increase in a size of the n-side external electrode 18n and the p-side external electrode 18p allows for increasing a mounting area on a mounting substrate.

Metals such as Cu, Au, and Ni can be preferably used for a material of the n-side external electrode 18n and the p-side external electrode 18p. A single layer or a layered structure formed of these metal materials can be used as the n-side external electrode 18n and the p-side external electrode 18p. In the n-side external electrode 18n and the p-side external electrode 18p, it is preferable that at least an uppermost layer, serving as a mounting surface, of each of the n-side external electrode 18n and the p-side external electrode 18p be formed of, for example, Au in order to increase bondability to a mounting substrate using an Au-alloy-based adhesive member such as an Au—Sn eutectic solder. The n-side external electrode 18n and the p-side external electrode 18p can be formed using, for example, a plating technique or a sputtering technique.

At the time of mounting, a conductive adhesive member is disposed between the n-side external electrode 18n and an external wiring pattern and between the p-side external electrode 18p and the external wiring pattern, and the adhesive member melts and then is cooled, so that each of the n-side external electrode 18n and the p-side external electrode 18p is connected to an external wiring pattern.

As described above, in the light-emitting element 1A according to the present embodiment, the n-side electrode 13 includes at least one first extending portion 13a and at least one second extending portion 13b each connected to corresponding one or more of the second regions 12nb. Furthermore, the second regions 12nb are not located between an end portion of the first extending portion 13a that is shorter in length than the second extending portion 13b and an end portion of the n-side semiconductor layer 12n in the first direction D1. With this structure, even when the p-side external electrode 18p is formed to be relatively large on the semiconductor layered body 12, the area of the p-side external electrode 18p overlapping the second regions 12nb can be reduced in a top plan view. With such an arrangement, a portion of the protection film 16 located between the p-side external electrode 18p and the n-side electrode 13 can be prevented from being damaged during the inspection of the light-emitting element. Thus, it is possible to prevent the p-side external electrode 18p and the n-side electrode 13 from being electrically connected with each other, so that reliability of the light-emitting element 1A can be improved.

Second Embodiment

Figure 5:
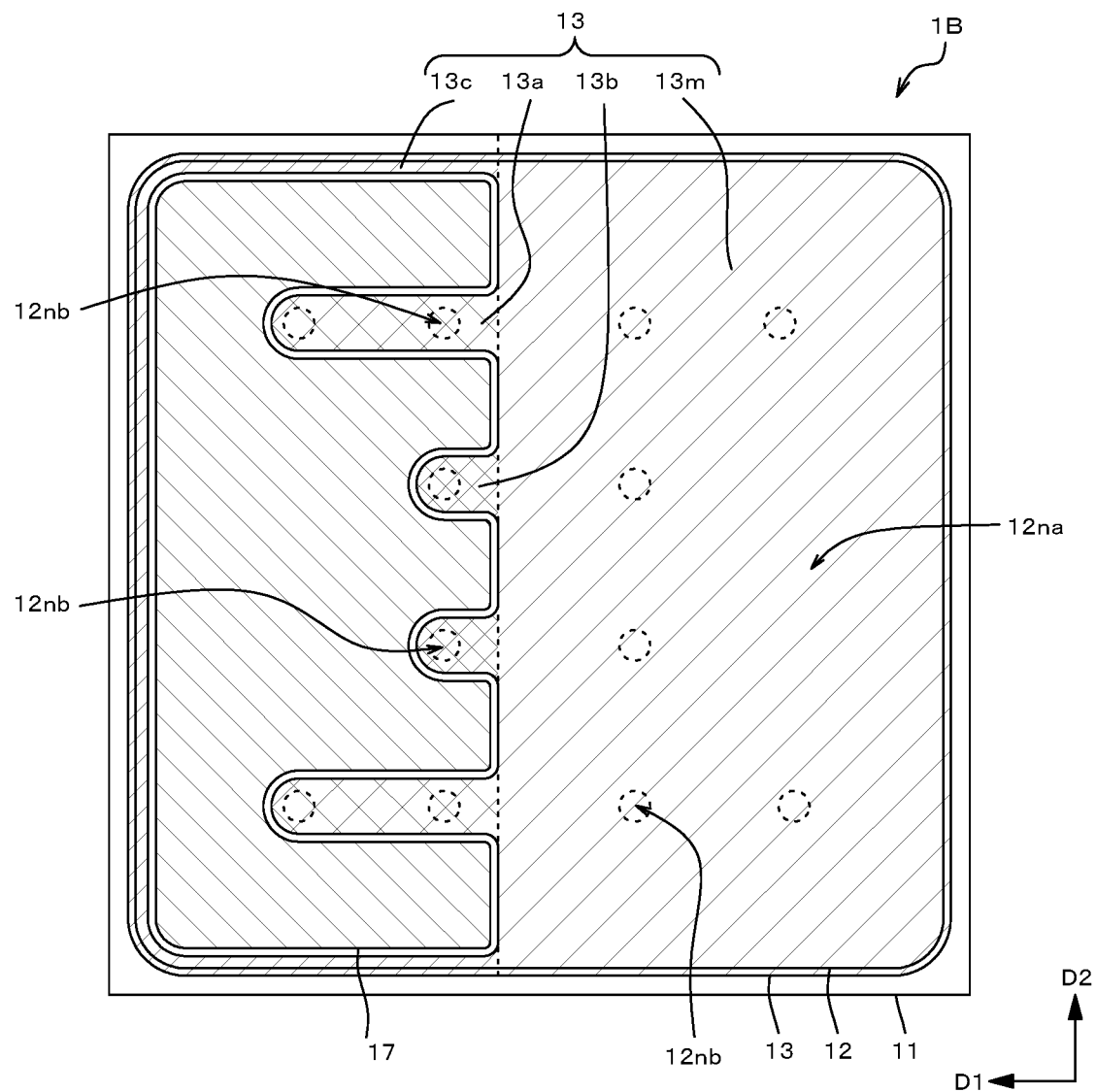
FIG. 5 is a diagram schematically illustrating a region where an n-side electrode and a p-side electrode are disposed in a light-emitting element according to a second embodiment.

FIG. 5 is a view illustrating regions where the n-side electrode 13 and the p-side electrode 17 are disposed in a top view, the regions indicated by hatchings. As illustrated in FIG. 5, in a light-emitting element 1B according to a second embodiment, the shapes of an n-side electrode 13 and a p-side electrode 17 and arrangement of second regions 12nb are mainly different from the light-emitting element 1A according to the first embodiment. Hereinafter, the same components as those of the light-emitting element 1A illustrated in FIGS. 1 to 4 are denoted by the same reference numerals, and detailed description thereof will be omitted.

In the light-emitting element 1B, a plurality of first extending portions 13a are located between a plurality of second extending portions 13b in a top view. The plurality of first extending portions 13a are located between one second extending portion 13b and another second extending portion 13b. In the present embodiment, each of an n-side external electrode 18n and a p-side external electrode 18p has a portion covering a first region 12na, the portion having relatively large area dimensions at a central portion of the n-side semiconductor layer 12n in a second direction D2.

With the light-emitting element 1B according to the present embodiment, an effect similar to an effect obtained from the light-emitting element 1A according to the first embodiment can be obtained. A portion of the n-side external electrode 18n and a portion of the p-side external electrode 18p that cover the first region 12na have relatively large area dimensions at the central portion of the n-side semiconductor layer 12n in the second direction D2. With this structure, a member for inspection can be prevented from contacting the p-side external electrode 18p covering the second regions 12nb, and thus it is possible to prevent a portion of a protection film 16 between the p-side external electrode 18p and the n-side electrode 13 from being damaged. Accordingly, it is possible to prevent the p-side external electrode 18p and the n-side electrode 13 from being electrically connected with each other, so that reliability of the light-emitting element 1B can be improved.

Third Embodiment

Light-emitting Device 100

Figure 6:
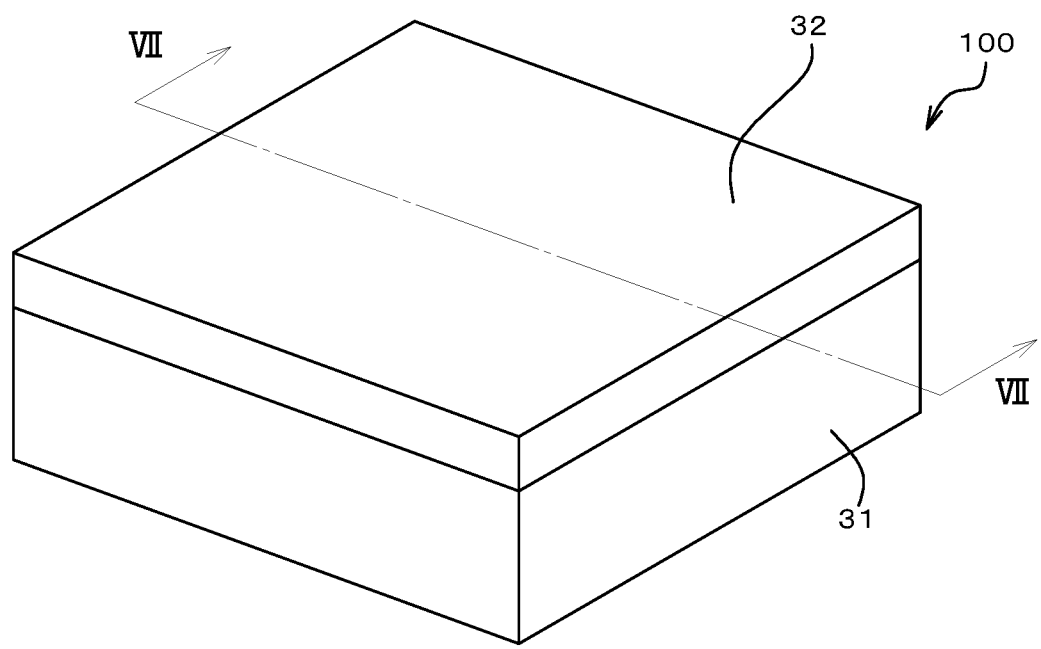
FIG. 6 is a schematic plan view illustrating a configuration of a light-emitting device according to a third embodiment.
Figure 7:
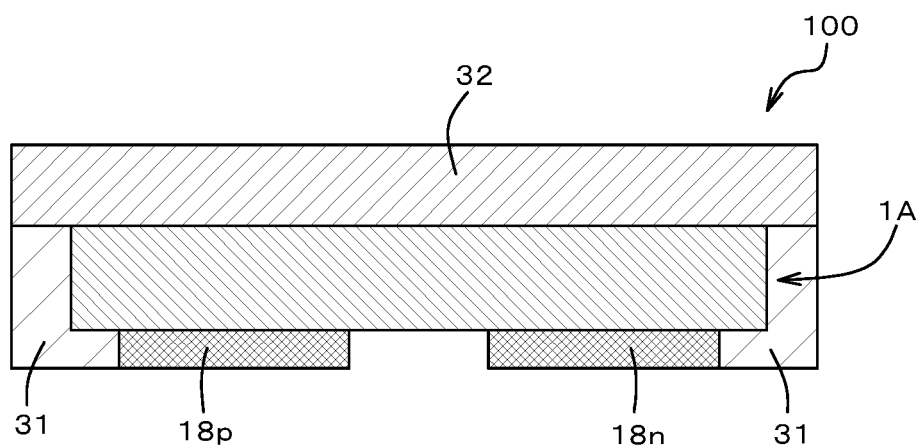
FIG. 7 is a schematic cross-sectional view taken along line VII-VII of FIG. 6.

As illustrated in FIGS. 6 and 7, a light-emitting device 100 according to a third embodiment includes a light-emitting element 1A, a covering member 31 covering lateral surfaces of the light-emitting element 1A, and a light transmissive member 32 disposed on an upper surface of the light-emitting element 1A.

Covering Member 31

As illustrated in FIGS. 6 and 7, the covering member 31 covers the lateral surfaces of the light-emitting element 1A. The covering member 31 covers the lateral surfaces of an n-side external electrode 18n and a p-side external electrode 18p. In order to secure mounting surfaces of the n-side external electrode 18n and the p-side external electrode 18p, it is preferable that the covering member 31 be disposed without covering the mounting surfaces of the n-side external electrode 18n and the p-side external electrode 18p.

A resin having light reflectivity is used for the covering member 31. For example, a resin containing a light reflective material can be used for the covering member 31. Examples of the resin include a silicone resin, a modified silicone resin, an epoxy resin, and the like. Examples of the light reflective material include titanium oxide, silicon oxide, alumina, and the like. With the covering member 31 having light reflectivity, it is possible to reflect light emitted from the light-emitting element 1A, so that light extraction efficiency can be improved.

Light Transmissive Member 32

In the light-emitting device 100, the light transmissive member 32 is disposed on the light-emitting element 1A. The light transmissive member 32 can contain a light reflective material and a phosphor adapted to perform wavelength conversion of a portion of light emitted from the light-emitting element 1A. The light transmissive member 32 can be formed of, for example, a resin, glass, a ceramic, or the like. In addition, sintered bodies of phosphors, and materials containing phosphors in resins, glass, and ceramics, and the like can be used for the light transmissive member 32 containing a phosphor.

In a case in which, for example, a light-emitting element configured to emit blue light or a light-emitting element configured to emit ultraviolet light is used for the light-emitting element 1A, a cerium-activated yttrium aluminum garnet phosphor (YAG: Ce), a cerium-activated lutetium aluminum garnet phosphor (LAG: Ce), a β-SIALON-based phosphor, a CASN-based phosphor, a SCASN-based phosphor, a KSF-based phosphor ($K_2SiF_6$: Mn), a sulfide-based phosphor, and the like can be used for the phosphor contained in the light transmissive member 32. It is possible to obtain a light-emitting device of a desired light emission color by combining these phosphors with a light-emitting element configured to emit blue light or a light-emitting element configured to emit ultraviolet light.

In a case in which the light transmissive member 32 is disposed to cover the upper surface of the light-emitting element 1A, the light transmissive member 32 can be bonded through an adhesive material. A light-transmissive resin such as an epoxy resin or a silicone resin can be used for the adhesive material. In addition, a direct bonding technique using, for example, surface activation bonding, atomic diffusion bonding, hydroxyl group bonding, or the like can be used for the bonding between the light transmissive member 32 and the upper surface of the light-emitting element 1A.

Certain embodiments of the present invention has been described above to provide specific examples of the light-emitting element according to the present invention, but the present invention is not limited to this description, and should be broadly construed based on the claims. Various modifications, variations, and the like based on this description are also encompassed by the present invention.

What is claimed is:

1. A light-emitting element comprising:
    a semiconductor layered body comprising:
        an n-side semiconductor layer having a first region and a plurality of second regions, the n-side semiconductor layer having a first lateral edge and a second lateral edge opposite the first lateral edge,
        a p-side semiconductor layer disposed on the first region, and
        a light-emitting layer disposed between the first region and the p-side semiconductor layer;
    an insulating film defining at least one p-side opening above the p-side semiconductor layer and a plurality of n-side openings each defined above a corresponding one of the plurality of second regions;
    an n-side electrode connected to each of the second regions at each corresponding one of the n-side openings; and
    a p-side electrode electrically connected to the p-side semiconductor layer through the p-side opening, the p-side electrode having a first lateral edge and a second lateral edge opposite the first lateral edge;
    wherein, in a top view, the n-side electrode comprises:
        a base portion located on the first region,
        one or more first extending portions having a first length, wherein each of the one or more first extending portions extends in a first direction from the base portion toward the first lateral edge of the n-side semiconductor layer, wherein each of the one or more first extending portions is connected to at least one of the second regions, and wherein each of the one or more first extending portions having an end portion on a side opposite the base portion, and
        one or more second extending portions having a second length longer than the first length, wherein each of the at least one or more second extending portions extends in the first direction from the base portion toward the first lateral edge of the n-side semiconductor layer, wherein each of the one or more second extending portions is connected to multiple ones of the second regions, and wherein each of the one or more second extending portions having an end portion on a side opposite the base portion;
    wherein the second regions are not located between the end portion of each of the one or more first extending portions and the first lateral edge of the n-side semiconductor layer in the first direction; and
    wherein a width of the p-side electrode in the first direction in a region between the end portion of each of the one or more first extending portions and the first lateral edge of the p-side electrode is greater than a width of the p-side electrode in the first direction in a region between the end portion of each of the one or more second extending portions and the first lateral edge of the p-side electrode.

2. The light-emitting element according to claim 1, wherein a quantity of the second regions connected to one of the one or more second extending portions is greater than a quantity of the second regions connected to one of the one or more first extending portions.

3. The light-emitting element according to claim 1, wherein a quantity of the second regions connected to the base portion is greater than a quantity of the second regions connected to one of the one or more second extending portions.

4. The light-emitting element according to claim 2, wherein a quantity of the second regions connected to the base portion is greater than a quantity of the second regions connected to one of the one or more second extending portions.

5. The light-emitting element according to claim 1, wherein:
    the n-side semiconductor layer comprises a third region located outward of the first region, and
    the n-side electrode further comprises a third extending portion extending from the base portion and connected to the third region.

6. The light-emitting element according to claim 2, wherein:
    the n-side semiconductor layer comprises a third region located outward of the first region, and
    the n-side electrode further comprises a third extending portion extending from the base portion and connected to the third region.

7. The light-emitting element according to claim 3, wherein:
    the n-side semiconductor layer comprises a third region located outward of the first region, and
    the n-side electrode further comprises a third extending portion extending from the base portion and connected to the third region.

8. The light-emitting element according to claim 1, wherein:
    the one or more first extending portions comprises a plurality of first extending portions, and the at one or more second extending portions comprises a plurality of second extending portions, and
    the plurality of second extending portions are disposed between the plurality of first extending portions in a second direction orthogonal to the first direction.

9. The light-emitting element according to claim 2, wherein:
    the one or more first extending portions comprises a plurality of first extending portions, and the one or more second extending portions comprises a plurality of second extending portions, and
    the plurality of second extending portions are disposed between the plurality of first extending portions in a second direction orthogonal to the first direction.

10. The light-emitting element according to claim 3, wherein:
    the one or more first extending portions comprises a plurality of first extending portions, and the one or more second extending portions comprises a plurality of second extending portions, and the plurality of second extending portions are disposed between the plurality of first extending portions in a second direction orthogonal to the first direction.

11. The light-emitting element according to claim 1, wherein the p-side electrode is surrounded by the n-side electrode in a top view.

12. The light-emitting element according to claim 2, wherein the p-side electrode is surrounded by the n-side electrode in a top view.

13. The light-emitting element according to claim 3, wherein the p-side electrode is surrounded by the n-side electrode in a top view.

14. The light-emitting element according to claim 8, wherein a width of the one or more first extending portions is the same as a width of the one or more second extending portions in the second direction.

15. The light-emitting element according to claim 9, wherein a width of the one or more first extending portions is the same as a width of the one or more second extending portions in the second direction.

16. The light-emitting element according to claim 10, wherein a width of the one or more first extending portions is the same as a width of the one or more second extending portions in the second direction.

17. The light-emitting element according to claim 1, wherein:
a reflective electrode is disposed on the p-side semiconductor layer, and
the p-side electrode is connected to the reflective electrode through the p-side opening.

18. The light-emitting element according to claim 2, wherein:
a reflective electrode is disposed on the p-side semiconductor layer, and
the p-side electrode is connected to the reflective electrode through the p-side opening.

19. The light-emitting element according to claim 3, wherein:
a reflective electrode is disposed on the p-side semiconductor layer, and
the p-side electrode is connected to the reflective electrode through the p-side opening.

20. The light-emitting element according to claim 1, wherein:
the second regions comprise one or more base regions, each of the one or more base regions is connected to the base portion and is disposed between each of the one or more first extending portions and the second lateral edge of the n-side semiconductor layer in the first direction.

* * * * *

UNITED STATES PATENT AND TRADEMARK OFFICE
CERTIFICATE OF CORRECTION

| | | |
|---|---|---|
| PATENT NO. | : 11,799,059 B2 | Page 1 of 1 |
| APPLICATION NO. | : 17/353265 | |
| DATED | : October 24, 2023 | |
| INVENTOR(S) | : Shinya Kondo | |

It is certified that error appears in the above-identified patent and that said Letters Patent is hereby corrected as shown below:

In the Claims

Claim 1, Column 11, Line 54:
Please delete:
"the at least one or more second extending portions."
Please replace with:
"the one or more second extending portions."

Signed and Sealed this
Twentieth Day of February, 2024

*Katherine Kelly Vidal*

Katherine Kelly Vidal
*Director of the United States Patent and Trademark Office*